(12) United States Patent
Stansell

(10) Patent No.: US 6,501,815 B1
(45) Date of Patent: Dec. 31, 2002

(54) LOADABLE DIVIDE-BY-N WITH FIXED DUTY CYCLE

(75) Inventor: Galen Stansell, Kirkland, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 56 days.

(21) Appl. No.: 09/607,697

(22) Filed: Jun. 30, 2000

(51) Int. Cl.[7] .......................... H03K 21/00; H03K 23/00
(52) U.S. Cl. ............................................ 377/47; 377/48
(58) Field of Search ..................... 377/47, 48; 327/115, 327/117, 175

(56) References Cited

U.S. PATENT DOCUMENTS

| | | | |
|---|---|---|---|
| 4,689,740 A | 8/1987 | Moelands et al. | 364/200 |
| 4,935,944 A * | 6/1990 | Everett | 377/48 |
| 5,084,907 A * | 1/1992 | Maemura | 377/48 |
| 5,172,400 A * | 12/1992 | Maemura | 377/48 |
| 5,559,502 A | 9/1996 | Schutte | 340/825.21 |
| 5,689,196 A | 11/1997 | Schutte | 326/86 |
| 5,867,068 A * | 2/1999 | Keating | 377/48 |
| 6,163,181 A * | 12/2000 | Nishiyama | 327/115 |

FOREIGN PATENT DOCUMENTS

| | | | | |
|---|---|---|---|---|
| WO | WO96/17305 | 6/1996 | ........... | G06F/13/40 |
| WO | WO98/34376 | 8/1998 | ........... | H04L/12/20 |
| WO | WO99/09712 | 2/1999 | ........... | H04L/12/40 |

* cited by examiner

*Primary Examiner*—Tuan T. Lam
(74) *Attorney, Agent, or Firm*—Christopher P. Maiorana, P.C.

(57) ABSTRACT

A circuit configured to generate an output signal having a first frequency in response to a clock signal having a second frequency. The output signal may be in a first state and a second state for an equal number of half-cycles of the clock signal.

18 Claims, 6 Drawing Sheets

LOADABLE DIVIDE-BY-N WITH FIXED DUTY CYCLE

FIELD OF THE INVENTION

The present invention relates to a method and/or architecture for frequency dividers generally and, more particularly, to a method and/or architecture for a loadable divide-by-N device with a fixed duty cycle.

BACKGROUND OF THE INVENTION

Conventional clock signals for systems requiring clocking (i.e., computer systems, microprocessors, controllers, etc.) are implemented using an oscillator to generate a reference signal and dividers to generate numerous clock signals. Clock signals can be characterized by a duty cycle. A duty cycle measures what portion of a clock signal period the clock signal is in a first state (i.e., a logic HIGH, or 1). For example, when a clock signal is in a HIGH state for one-half of the clock period and a LOW state for one-half of the period, the clock signal has a fifty percent (50%) duty cycle.

The clock signal can also be described as having a first half-cycle and a second half-cycle. The clock signal is in a first state during the first half-cycle and a second state during the second half-cycle. A half-cycle can be shorter or longer than half of the clock period depending upon the duty cycle of the clock signal. For example, a 50% duty cycle clock signal has half-cycles that are both one-half of the clock period. However, a clock signal with a 25% duty cycle has a first half-cycle that is one-quarter of the clock period and a second half-cycle that is three-quarters of the clock period. A clock signal with a 75% duty cycle has a first half-cycle that is three-quarters of the clock period and a second half-cycle that is one-quarter of the clock period.

In conventional clock generators, loadable dividers are used to divide the reference signal to generate a lower frequency clock signal. However, conventional loadable dividers can have either a very low (i.e., significantly less than 50%) or very high (i.e., significantly greater than 50%) duty cycle. When a 50% duty cycle clock is required, a conventional loadable divider is followed by a toggle flip-flop. The toggle flip-flop performs a divide-by-2 operation to get a 50% duty cycle. A disadvantage of using the toggle flip-flop to get a 50% duty cycle is that the conventional frequency divider cannot provide a 50% duty cycle clock with a frequency that is an odd fraction ( or multiple, if the divider is part of a phase lock loop circuit) of the reference frequency.

A loadable divider that could divide by an odd integer and provide a 50% duty cycle would be desirable.

SUMMARY OF THE INVENTION

The present invention concerns an apparatus comprising a circuit configured to generate an output signal having a first frequency in response to a clock signal having a second frequency. The output signal may be in a first state and a second state for an equal number of half-cycles of the clock signal.

The objects, features and advantages of the present invention include a method and/or architecture for a loadable divide-by-N device that may (i) enable flexibility in output frequencies and/or (ii) improve frequency resolution by opening up post-divide space.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
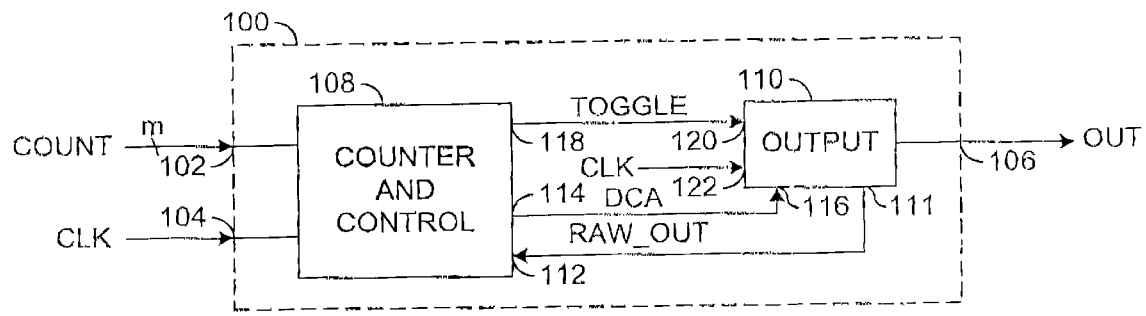
FIG. 1 is a block diagram illustrating a preferred embodiment of the present invention.

Referring to FIG. 1, a block diagram of a circuit 100 illustrating a preferred embodiment of the present invention is shown. The circuit 100 may be, in one example, a frequency divider circuit. The circuit 100 may be implemented, in one example, as a loadable divide-by-N circuit, where N is an integer. In one example, the circuit 100 may provide a 50% duty cycle output in response to a 50% duty cycle input even when N has an odd value. The circuit 100 may have an input 102 that may receive a signal (e.g., COUNT), an input 104 that may receive a signal (e.g., CLK), and an output 106 that may present a signal (e.g., OUT). The signal COUNT may be used, in one example, to set the divisor value N. The signal CLK may be, in one example, a reference clock signal that may have a frequency (e.g., Fclk). The signal OUT may be, in one example, an output signal having a frequency (e.g., Fout) that may be a fraction of the frequency of the signal CLK (e.g., Fout=Fclk/N). The signal COUNT may be, in one example, an M-bit wide digital signal, where M is an integer. The signal COUNT may be, in one example, a binary representation of the value N. The circuit 100 may be configured to generate the signal OUT in response to the signals COUNT and CLK.

The circuit 100 may comprise a circuit 108 and a circuit 110. In one example, (i) the circuit 108 may be implemented as a counter and control circuit and (ii) the circuit 110 may be implemented as a divider output circuit. The signals COUNT and CLK may be presented to inputs of the circuit 108. The output circuit 110 may have an output 111 that may present a signal (e.g., RAW_OUT) to an input 112 of the circuit 108. The circuit 108 may have an output 114 that may present a signal (e.g., DCA) to an input 116 of the circuit 110 and an output 118 that may present a signal (e.g., TOGGLE) to an input 120 of the circuit 110. The signal TOGGLE may be implemented to generate a transition of the signal OUT (to be discussed in connection with FIGS. 3 and 4). The signal DCA may be implemented, in one example, as a duty cycle correction signal. The circuit 108 may be configured to generate the signals TOGGLE and DCA in response to one or more of the signals COUNT, CLK, and RAW_OUT.

The circuit 110 may have an input 122 that may receive the signal CLK. The circuit 110 may be configured to generate the signal OUT in response to the signals TOGGLE, CLK, and DCA.

Figure 2:
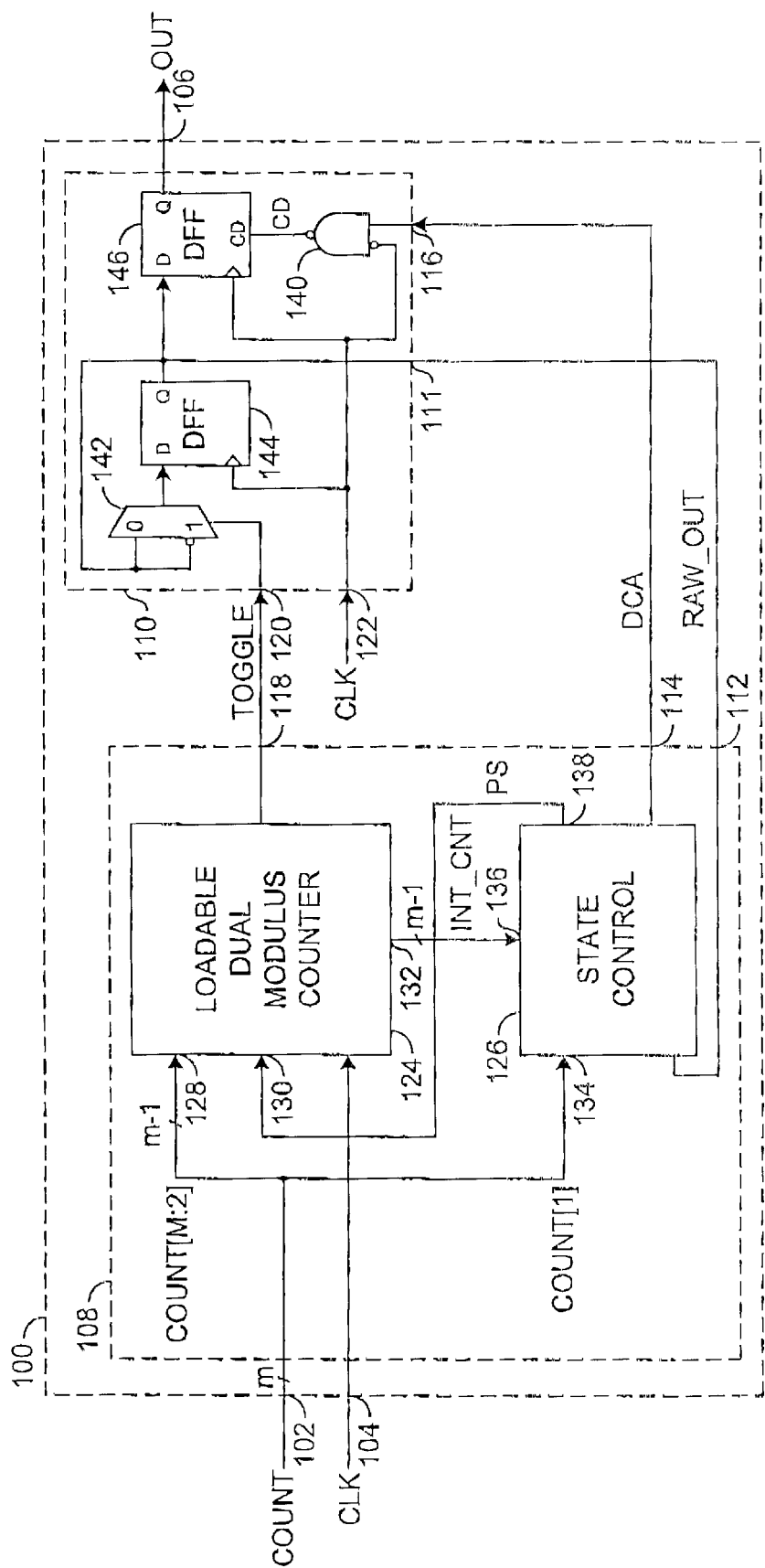
FIG. 2 is a detailed block diagram of a preferred embodiment of the present invention.

Referring to FIG. 2, a detailed block diagram of the circuit 100 illustrating a preferred embodiment of the present invention is shown. The circuit 108 may comprise a circuit 124 and a circuit 126. The circuit 124 may be implemented as, in one example, a loadable, dual modulus (e.g., both N and N+1) counter. The signal CLK may be presented to an input of the circuit 124. The circuit 124 may have an input 128 that may receive the most significant M−1 bits of the signal COUNT (e.g., COUNT[M:2]), an input 130 that may receive a signal (e.g., PS), and an output 132 that may present a signal (e.g., INT_CNT). The signal INT_CNT may be implemented, in one example, as a digital signal that may be (M−1)-bits wide. The signal PS may be implemented, in one example, as a control signal. The circuit 124 may be configured to count in (i) a first modulus (e.g., N) in response to a first state (e.g., a logic LOW, or 0) of the signal PS or (ii) a second modulus (e.g., N+1) in response to a second state (e.g., a logic HIGH, or 1) of the signal PS. The signal TOGGLE may be presented at an output of the circuit 124. The circuit 124 may be configured to generate the signals TOGGLE and INT_CNT in response to the signals COUNT[M:2], PS, and CLK.

The circuit 126 may be implemented as, in one example, a state machine that may control the modulus of the circuit 124. The signal RAW_OUT may be presented to an input of the circuit 126. The circuit 126 may have an input 134 that may receive the least significant bit of the signal COUNT (e.g., COUNT), an input 136 that may receive the signal INT_CNT, an output 138 that may present the signal PS, and an output that may present the signal DCA. In one example, the signal COUNT may be used as a control signal. The circuit 126 may be configured to generate the signals PS and DCA in response to the signals COUNT, INT_CNT, and RAW_OUT. The signal PS may be used, in one example, as a state variable of the state machine 126.

The circuit 110 may comprise, in one example, a gate 140, a multiplexer 142, a flip-flop 144 and a flip-flop 146. The gate 140 may be implemented, in one example, as a NAND gate having an inverting and a non-inverting input. However, other types of gates may be implemented accordingly to meet the design criteria of a particular application. The signals CLK and DCA may be presented to the inverting and non-inverting inputs of the gate 140, respectively. The gate 140 may have an output that may present a signal (e.g., CD) to a reset (clear) input of the flip-flop 146. In one example, the signal CD may be implemented as a control signal.

The signal RAW_OUT may be presented to an inverting and a non-inverting input of the multiplexer 142. The signal TOGGLE may be presented to a control input of the multiplexer 142. In one example, the multiplexer 142 may be configured to select (i) the non-inverting input in response to a LOW logic state (e.g., a digital 0) of the signal TOGGLE and (ii) the inverting input in response to a HIGH logic state (e.g., a digital 1) of the signal TOGGLE. The multiplexer 142 may have an output that may present a signal (e.g., RAW_OUT or /RAW_OUT) to an input (e.g., a D-input) of the flip-flop 144.

The flip-flop 144 may have an output (e.g., a Q output) that may present the signal RAW_OUT. The signal RAW_OUT may be presented to an input (e.g., a D-input) of the flip-flop 146. The signal CLK may be present to a clock input of the flip-flops 144 and 146. The flip-flop 144 and the flip-flop 146 may be implemented, in one example, as D-type flip-flops. However, other types of flip-flops may be implemented to meet the design criteria of a particular application. The flip-flop 146 may present the signal OUT at an output (e.g., Q output).

The flip-flop 146 may generate the signal OUT in response to the signal CLK, the signal RAW_OUT and the signal CD. Additionally, the flip-flop 146 may be implemented to perform duty cycle adjust functions. The flip-flop 146 may be implemented to shift the signal RAW_OUT over one clock cycle to form the signal OUT. Shifting of the signal RAW_OUT may allow the circuit 100 to easily deskew the signal OUT from a signal similarly phase shifted from the signal INT_CNT.

In one example, the loadable dual modulus counter circuit 124 may have two modes of counting (e.g., count to or from N and count to or from N+1). The N and N+1 modes of counting may count half cycles of the signal CLK. The circuit 100 may be configured, in one example, to minimize a deviation in the duty cycle of the signal OUT from 50%. When the signal CLK has a 50% duty cycle, the circuit 100 may be configured to generate the signal OUT with a 50% duty cycle. The signal OUT may be in a first state (e.g., a digital high or "1") and a second state (e.g., a digital low or "0") for an equal number of half-cycles of the signal CLK. However, if desirable the duty cycle may be programmed to a non-50% value.

In general, when the signal OUT is in a first state (e.g., a logic HIGH, or 1), the circuit 126 may control the circuit 124 to count N/2+N %2 cycles of the signal CLK, where the / symbol indicates an integer division and the % symbol indicates a modulus or remainder function. When the signal OUT is in a second state (e.g., a logic LOW, or 0), the circuit 126 may control the circuit 124 to count N/2 cycles of the signal CLK.

For example, when N=13 and no duty cycle correction is applied, the signal OUT may be in the first state for 7 cycles of the signal CLK and in the second state for 6 cycles of the signal CLK. In another example, when N=12, the signal OUT may be in the first state for 6 cycles of the signal CLK and in the second state for 6 cycles of the signal CLK. The above examples may be illustrated using binary numbers for the signal COUNT as follows:

| COUNT = N = 1101 (13) | COUNT = N = 1100 (12) |
|---|---|
| N/2 = 110 (6) ; N % 2 = 1<br>Count 6 + 1 cycles/toggle<br>Count 6 cycles /toggle | N/2 = 110 (6) ; N % 2 = 0<br>Count 6 + 0 cycles/toggle<br>Count 6 cycles/toggle |
| 13 cycles total | 12 cycles total |

The duty cycle of the signal OUT may be corrected as follows: When (i) the signal OUT is in the first state and (ii) N %2=1, the signal INT_CNT=0, and the signal CLK is LOW, switch the signal OUT to the second state. In other words, the circuit 100 may correct the duty cycle of the signal OUT by stealing a half-cycle of the signal CLK from the time the signal OUT is the first state and adding the half-cycle of the signal CLK to the time the signal OUT is in the second state.

The circuit 126 may present the signal DCA. The signal DCA may be used, in one example, to adjust the duty cycle of the signal OUT (e.g., toggle the signal OUT to the second state). For example, the circuit 100 may adjust the duty cycle of the signal OUT by a half-cycle of signal CLK. When N is an even number, the signal OUT will generally have a 50% duty cycle.

The signal OUT generally changes states on a first transition of the signal CLK (e.g., a LOW to HIGH transition). However, when an adjustment of the duty cycle of the signal OUT is made, the signal OUT may change states on a second transition of the signal CLK (e.g., a HIGH to LOW transition).

Figure 3:
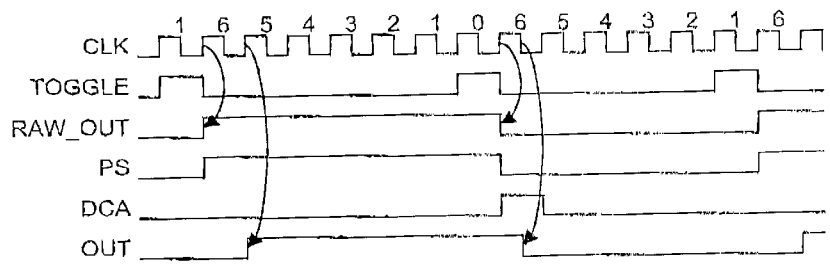
FIG. 3 is a timing diagram illustrating an operation of the present invention according to FIGS. 1 and 2.

Referring to FIG. 3, a timing diagram illustrating an example operation of the circuit 100 is shown. The signal CLK may be implemented, in one example, as a 50% duty-cycle clock signal. When the value N is an odd integer, the signal OUT may have a duty cycle larger than 50%. For example, when N=13 the signal OUT will generally have one period for every 13 periods of the signal CLK. The signal OUT may have a duty cycle of 7/13. However, a frequency divider implemented in accordance with the present invention (e.g., the circuit 100) may adjust the duty cycle of the signal OUT by a half-cycle of the signal CLK. When the signal CLK has a duty cycle of 50%, the adjustment of the signal OUT may result in the signal OUT having duty cycle of 50%. Depending upon the duty cycle of the signal CLK, the duty cycle of the signal OUT may be adjusted, in one example, to be within one-half period of the signal CLK around 50%.

Figure 4:
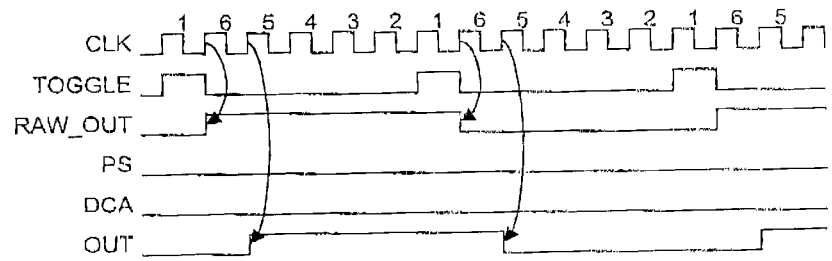
FIG. 4 is a timing diagram illustrating an operation of the present invention according to FIGS. 1 and 2.

Referring to FIG. 4, a timing diagram illustrating an example operation of the circuit 100 is shown. The signal CLK may be implemented, in one example, as a 50% duty-cycle clock signal. When the value N is an even integer, the signal OUT may have a duty cycle of approximately 50%. For example, when N=12 the signal OUT will generally have one period for every 12 periods of the signal CLK. A frequency divider implemented in accordance with the present invention (e.g., the circuit 100) may adjust the duty cycle of the signal OUT. When the signal CLK has a duty cycle of 50%, the adjustment of the signal OUT may result in the signal OUT having duty cycle of 50%.

Figure 5:
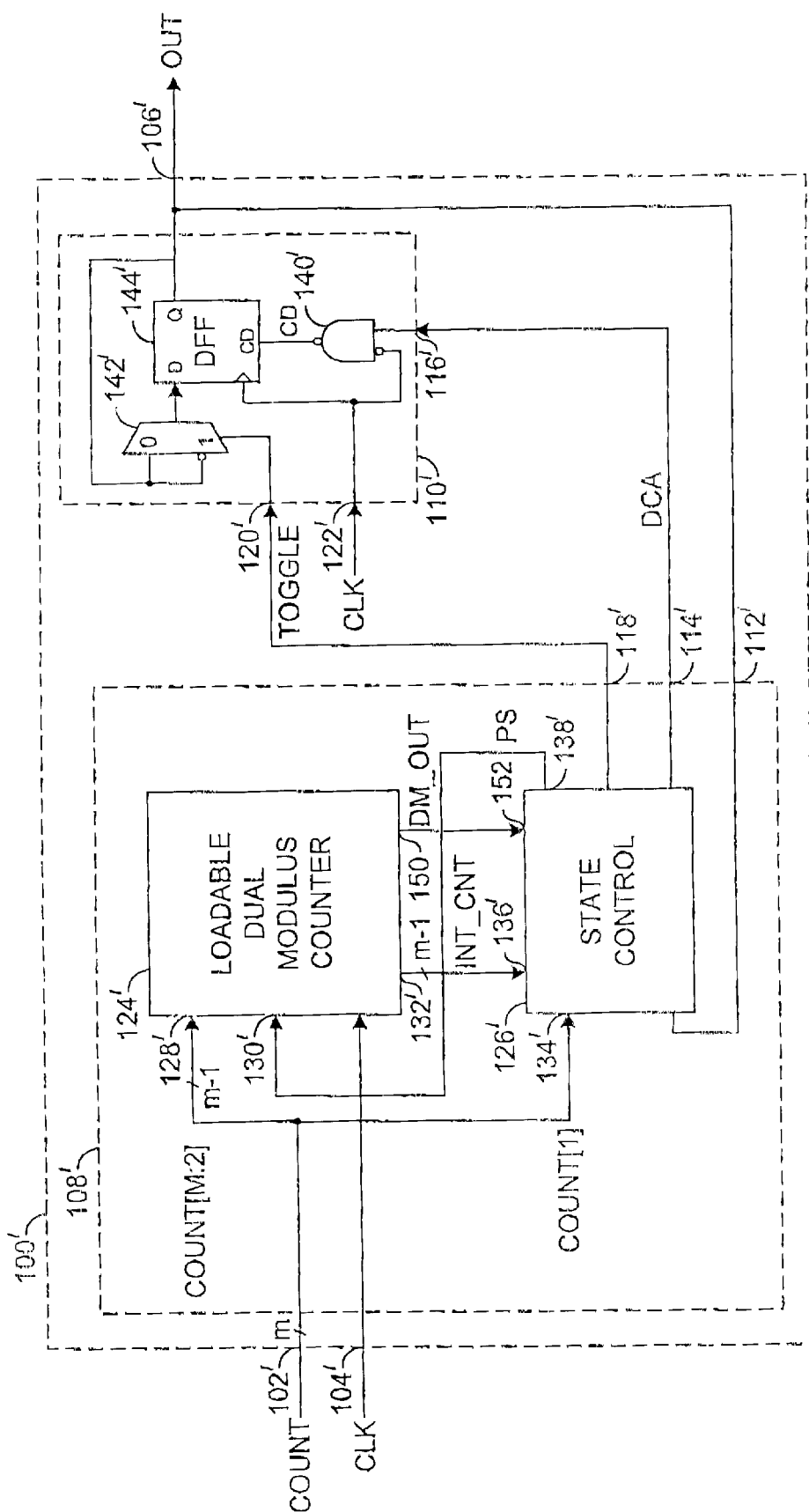
FIG. 5 is a detailed block diagram of an another preferred embodiment of the present invention.

Referring to FIG. 5, another embodiment of the present invention is shown marked with primed notation. The dual modulus counter 124' may have an output 150 that may present a signal (e.g., DM_OUT) to an input 152 of the state control circuit 126'. The signal DM_OUT may condition the state control circuit 126' for an appropriate type of divide (e.g., odd or even). Additionally, the flip-flop 144' may be configured to generate the signal OUT and be controlled by the signal CD. Additionally, the signal OUT may be presented to the input 112' of circuit 108'.

Figure 6:
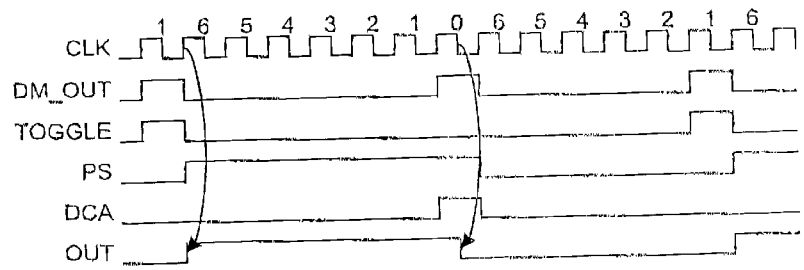
FIG. 6 is a timing diagram illustrating an operation of the present invention according to FIG. 5.

Referring to FIG. 6, a timing diagram illustrating an example operation of the circuit 100' is shown. The signal CLK may be implemented, in one example, as a 50% duty-cycle clock signal.

When the value N is an odd integer, the signal OUT may have a duty cycle larger than 50%. For example, when N=13 the signal OUT will generally have one period for every 13 periods of the signal CLK. The signal OUT may have a duty cycle of 7/13. However, a frequency divider implemented in accordance with the present invention (e.g., the circuit 100') may adjust the duty cycle of the signal OUT by a half-cycle of the signal CLK. When the signal CLK has a duty cycle of 50%, the adjustment of the signal OUT may result in the signal OUT having duty cycle of 50%. Depending upon the duty cycle of the signal CLK, the duty cycle of the signal OUT may be adjusted, in one example, to be within one-half period of the signal CLK around 50%.

Figure 7:
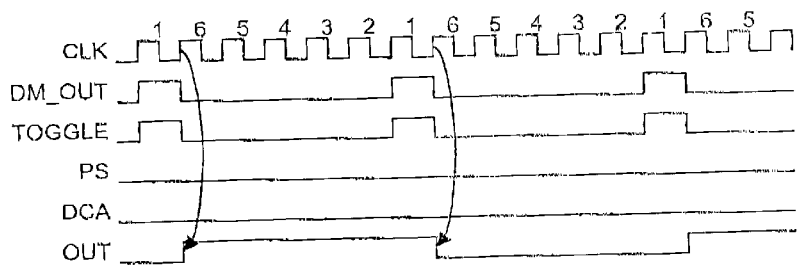
FIG. 7 is a timing diagram illustrating an operation of the present invention according to FIG. 5.

Referring to FIG. 7, a timing diagram illustrating an example operation of the circuit 100 is shown. The signal CLK may be implemented, in one example, as a 50% duty-cycle clock signal. When the value N is an even integer, the signal OUT may have a duty cycle of approximately 50%. For example, when N=12 the signal OUT will generally have one period for every 12 periods of the signal CLK. A frequency divider implemented in accordance with the present invention (e.g., the circuit 100') may adjust the duty cycle of the signal OUT. When the signal CLK has a duty cycle of 50%, the adjustment of the signal OUT may result in the signal OUT having duty cycle of 50%.

Figure 8:
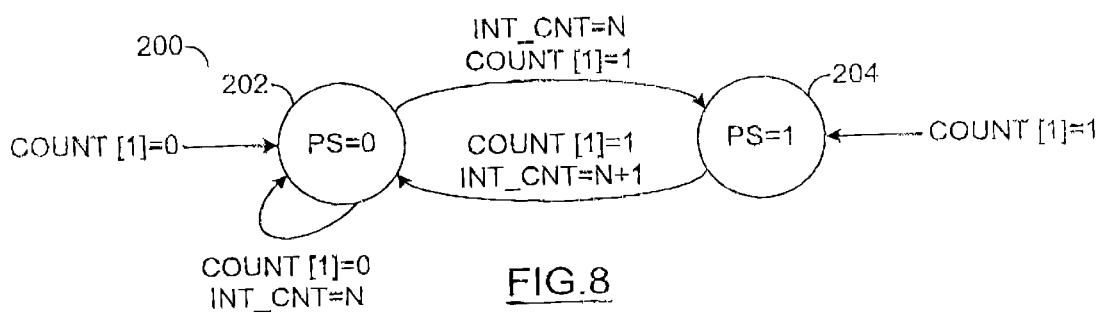
FIG. 8 is a state diagram illustrating an operation topology of the loadable divider of FIG. 1.

Referring to FIG. 8, a state diagram 200 illustrating an operation topology of the state control circuit 126 of FIG. 2 is own. The circuit 126 may have a first state 202 where the signal may be in a first state (e.g., a digital LOW or "0") and a second state 204 where the signal PS may be in a second state (e.g., a digital HIGH or "1"). When the signal COUNT is a digital 0 (e.g., N is an even integer), the circuit 126 generally enters the state 202. When the signal COUNT is a digital 1 (e.g., N is an odd integer), the circuit 126 generally enters the state 204.

The circuit 126 generally moves from the state 202 to the state 204 (i) when the signal INT_CNT=N and the signal COUNT[1]=1. The circuit 126 generally moves from the state 204 to the state 202 (i) when the signal INT_CNT=N+1 and the signal COUNT[1]=1. When the signal COUNT[1]=1 the circuit 126 generally remains in the state 202.

Figure 9:
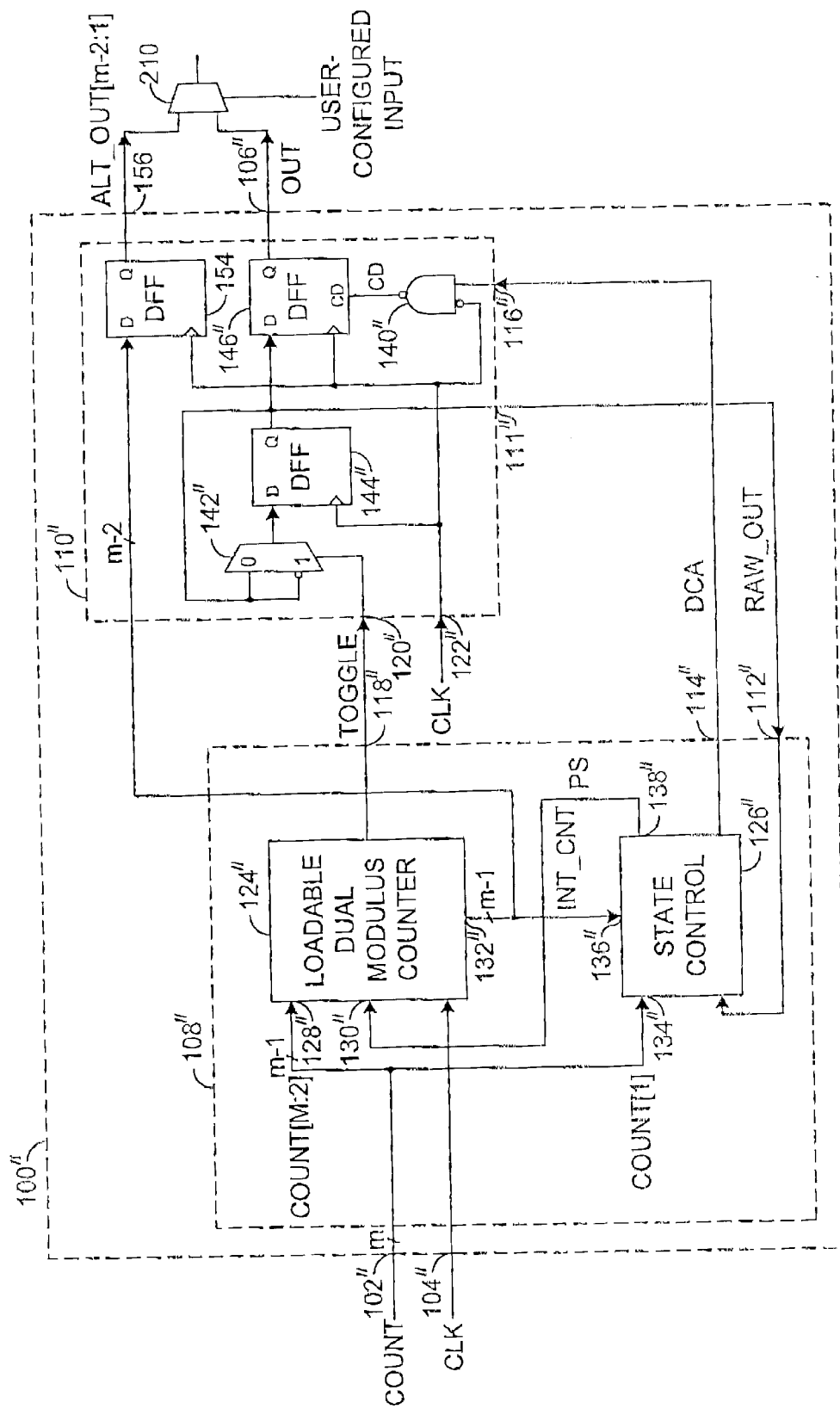
FIG. 9 is a block diagram illustrating an alternative embodiment of the present invention according to FIGS. 1 and 2.

Referring to FIG. 9, a block diagram of an alternative embodiment of the present invention of FIGS. 1 and 2 is shown marked with double primed notation. The circuit 100" may be similar to the circuit 100. However, a flip-flop 154 may be configured to register the signal INT_CNT of the dual modulus counter 124". The flip-flop 154 may have an output (e.g., a Q output) that may present a signal (e.g., ALT_OUT). In one example, the signal ALT_OUT may be implemented as a multi-bit signal. Additionally, the circuit 100" may have an output 156 that may present the signal ALT_OUT. The signal ALT_OUT may be presented to a number of external devices (not shown). In one example, a multiplexer 210 may have a first input that may receive the signal OUT, a second input that may receive the signal ALT_OUT, and a control input that may receive a user-configured input. Alternatively, the signal ALT_OUT may be presented to a number of N-to-1 multiplexers. Each multiplexer may be separately controlled in order to independently select a clock source for an output of each multiplexer.

Figure 10:
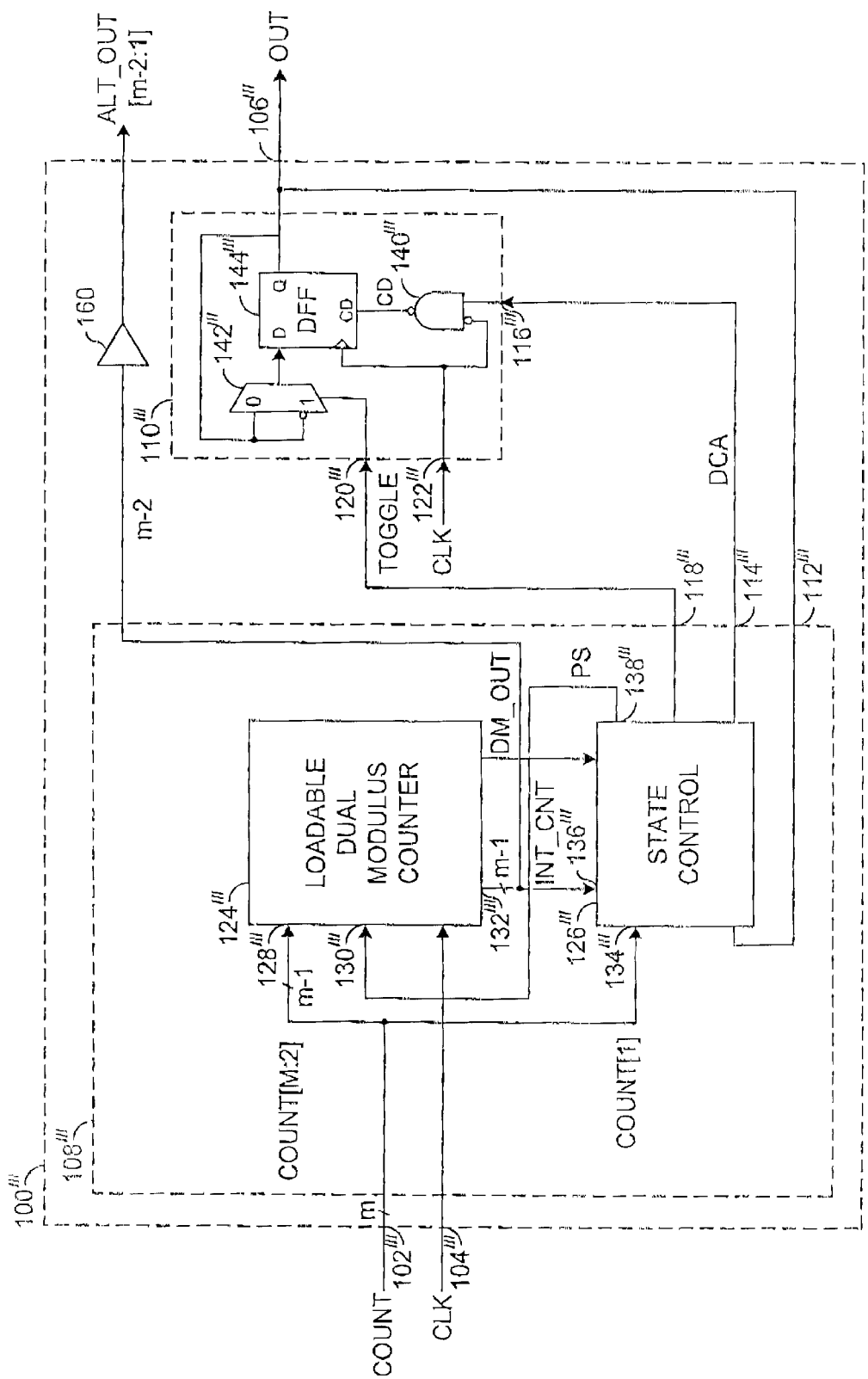
FIG. 10 is a block diagram illustrating an alternative embodiment of the present invention according to FIG. 5.

Referring to FIG. 10, a block diagram of an alternative embodiment of the present invention of FIG. 5 is shown marked with triple primed notation. The circuit 100''' may be similar to the circuit 100. However, a buffer 160 may be configured to receive the signal INT_CNT of the dual modulus counter 124'''. Additionally, The buffer 160 may present the output signal ALT_OUT. The buffer 160 may temporarily buffer the signal INT_CLK. The signal ALT_OUT may be presented to a number of external devices (not shown) as previously described.

The various signals are generally "on" (e.g., a digital HIGH, or 1) or "off" (e.g., a digital LOW or 0). However, the particular polarities of the on (e.g., asserted) and off (e.g., de-asserted) states of the signals may be adjusted (e.g., reversed) accordingly to meet the design criteria of a particular implementation.

The circuit 100 may provide a loadable divide-by-N device that may enable flexibility in output frequencies. Additionally, the circuit 100 may improve frequency resolution of an output frequency by opening up post-divide space.

While the invention has been particularly shown and described with reference to the preferred embodiments thereof, it will be understood by those skilled in the art that various changes in form and details may be made without departing from the spirit and scope of the invention.

What is claimed is:

1. A circuit configured to generate an output signal having a first frequency in response to a clock signal having a second frequency, wherein said output signal (i) switches from a first state to a second state in response to said clock signal and a correction signal generated in response to an intermediate count signal when a ration of said second frequency to said first frequency is an odd integer and (ii) is in said first state and said second state for an equal number of half-cycles of said clock signal.

2. The circuit according to claim 1, wherein said clock signal and said output signal have a fifty-percent (50%) duty cycle.

3. The circuit according to claim 1, wherein said ratio of said second frequency to said first frequency is determined by a count signal.

4. The circuit according to claim 3, wherein said ratio is programmable.

5. The circuit according to claim 1, comprising:
   a first circuit configured to generate an intermediate signal and said correction signal in response to said clock signal and a count signal; and
   a second circuit configured to generate said output signal in response to said intermediate signal, said clock signal, and said correction signal.

6. The circuit according to claim 5, wherein said count signal comprises a multi-bit digital signal.

7. The circuit according to claim 5, wherein said count signal is a binary representation of said ratio between said second frequency and said first frequency.

8. The circuit according to claim 5, wherein said second circuit comprises one or more flip-flops.

9. The circuit according to claim 8, wherein each of said one or more flip-flops comprise a D or T-type flip-flop.

10. The circuit according to claim 1, further comprising a multiplexer configured to select said output signal or a second output signal in response to a user-configured input signal, wherein said second output signal is in a first and a second state, for a number of periods of said clock signal.

11. The circuit according to claim 8, wherein at least one of said one or more flip-flops are reset in response to said clock signal and said correction signal.

12. The circuit according to claim 5, wherein said first circuit comprises:

a dual modulus counter circuit configured to generate said intermediate signal and said intermediate count signal in response to (i) a first portion of said count signal, (ii) a control signal, and (iii) said clock signal, and
   a state control circuit configured to generate said correction signal and said control signal in response to (i) a second portion of said count signal, (ii) said intermediate count signal, and (iii) said output signal.

13. A circuit comprising:
   means for generating an output signal having a first frequency in response to a clock signal halving a second frequency, wherein said output signal is in a first state and at second state for an equal number of half-cycles of said clock signal; and
   means for switching said output signal from said first state to said second state in response to said clock signal and a correction signal generated in response to an intermediate count signal when a ratio of said second frequency to said first frequency is an odd integer.

14. A method for generating a divide-by-N output frequency signal comprising the steps of:
   (A) generating an output signal having a first frequency in response to a clock signal having a second frequency; and
   (B) switching said output signal from a first state to a second state in response to said clock signal and a correction signal generated in response to an intermediate count signal when a ratio of said second frequency to said first frequency is an odd integer, wherein an equal number of half-cycles of said clock signal occur during said first state and said second state.

15. The method according to claim 14, wherein step (A) comprises the sub-steps of:
   (A-1) counting according to a first modulus in response to a first state of a control signal; and
   (A-2) counting according to a second modulus in response to a second state of said control signal.

16. The method according to claim 15, further comprising the sub-step of:
   (A-3) repeating sub-steps A-1 and A-2.

17. The method according to claim 15, wherein step (A) is performed using a dual modulus counter.

18. The method according to claim 17, wherein said dual modulus counter is loadable.

* * * * *

UNITED STATES PATENT AND TRADEMARK OFFICE
CERTIFICATE OF CORRECTION

| | | |
|---|---|---|
| PATENT NO. | : 6,501,815 B1 | Page 1 of 1 |
| APPLICATION NO. | : 09/607697 | |
| DATED | : December 31, 2002 | |
| INVENTOR(S) | : Galen Stansell | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this

Fourteenth Day of February, 2012

David J. Kappos
*Director of the United States Patent and Trademark Office*